(12) United States Patent
Zhao et al.

(10) Patent No.: US 11,049,449 B2
(45) Date of Patent: Jun. 29, 2021

(54) PIXEL CIRCUITS, DRIVING METHODS THEREOF AND DISPLAY DEVICES SOLVING AN UNEVEN DISPLAY LUMINANCE

(71) Applicant: Yungu (Gu'an) Technology Co., Ltd., Langfang (CN)

(72) Inventors: Min Zhao, Kunshan (CN); Suhua Li, Kunshan (CN); Peng Wang, Kunshan (CN); Zhaoyue Zhu, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 0 days.

(21) Appl. No.: 16/422,309

(22) Filed: May 24, 2019

(65) Prior Publication Data

US 2019/0279569 A1 Sep. 12, 2019

Related U.S. Application Data

(63) Continuation of application No. PCT/CN2018/091232, filed on Jun. 14, 2018.

(30) Foreign Application Priority Data

Oct. 31, 2017 (CN) .......................... 201711047038.4

(51) Int. Cl.
*G09G 3/3233* (2016.01)
*G09G 3/3266* (2016.01)
(Continued)

(52) U.S. Cl.
CPC ............. *G09G 3/3233* (2013.01); *G09G 3/20* (2013.01); *G09G 3/32* (2013.01); *G09G 3/3208* (2013.01);
(Continued)

(58) Field of Classification Search
CPC .......... G09G 3/20; G09G 3/32; G09G 3/3208; G09G 3/3225; G09G 3/3233;
(Continued)

(56) References Cited

U.S. PATENT DOCUMENTS

2005/0017934 A1\* 1/2005 Chung ................. G09G 3/3233
345/82
2007/0229411 A1\* 10/2007 Choi .................... G09G 3/3233
345/76
(Continued)

FOREIGN PATENT DOCUMENTS

CN 1949343 A 4/2007
CN 102089798 A 6/2011
(Continued)

OTHER PUBLICATIONS

English translation of International Search Report and Written Opinion dated Aug. 31, 2018 in corresponding International application No. PCT/CN2018/091232; 13 pages.
(Continued)

*Primary Examiner* — Keith L Crawley
(74) *Attorney, Agent, or Firm* — Maier & Maier, PLLC

(57) ABSTRACT

The disclosure discloses a pixel circuit, a driving method thereof, and a display device. The pixel circuit includes a first thin film transistor, a second thin film transistor, a third thin film transistor, a fourth thin film transistor, a fifth thin film transistor, a sixth thin film transistor, a seventh thin film transistors, a light-emitting diodes and a storage capacitor.

8 Claims, 1 Drawing Sheet

(51) Int. Cl.
*G09G 3/3291* (2016.01)
*G09G 3/20* (2006.01)
*G09G 3/3225* (2016.01)
*G09G 3/3208* (2016.01)
*G09G 3/32* (2016.01)
*H01L 27/32* (2006.01)

(52) U.S. Cl.
CPC ......... *G09G 3/3225* (2013.01); *G09G 3/3266* (2013.01); *G09G 3/3291* (2013.01); *G09G 2300/0426* (2013.01); *G09G 2300/0439* (2013.01); *G09G 2300/0809* (2013.01); *G09G 2300/0819* (2013.01); *G09G 2310/0251* (2013.01); *G09G 2320/043* (2013.01); *H01L 27/3244* (2013.01); *H01L 27/3276* (2013.01)

(58) Field of Classification Search
CPC .. G09G 3/3258; G09G 3/3291; G09G 3/3266; G09G 2300/0426; G09G 2300/0439; G09G 2300/0809; G09G 2300/0814; G09G 2300/0819; G09G 2300/0842; G09G 2310/0251; G09G 2310/0262; G09G 2320/0233; G09G 2320/043; G09G 2320/045; H01L 27/3244; H01L 27/3276
See application file for complete search history.

(56) References Cited

U.S. PATENT DOCUMENTS

| | | | | |
|---|---|---|---|---|
| 2008/0036704 A1* | 2/2008 | Kim | ...................... | G09G 3/3233 345/76 |
| 2009/0225013 A1 | 9/2009 | Lee et al. | | |
| 2011/0273429 A1 | 11/2011 | Choi | | |
| 2016/0307504 A1 | 10/2016 | Hung et al. | | |
| 2017/0110054 A1* | 4/2017 | Sun | ...................... | G09G 3/3258 |
| 2017/0148389 A1* | 5/2017 | Zhou | ...................... | G09G 3/3233 |
| 2018/0005569 A1* | 1/2018 | Li | ...................... | G09G 3/3233 |
| 2019/0043426 A1* | 2/2019 | Zhang | ...................... | G09G 3/3258 |
| 2019/0096336 A1* | 3/2019 | Lee | ...................... | G09G 3/3266 |
| 2019/0266947 A1* | 8/2019 | Zhou | ...................... | G09G 3/3258 |
| 2019/0279573 A1* | 9/2019 | Zhou | ...................... | G02F 1/061 |
| 2019/0287462 A1* | 9/2019 | Zhou | ...................... | G09G 3/3266 |

FOREIGN PATENT DOCUMENTS

| | | | |
|---|---|---|---|
| CN | 103208255 A | | 7/2013 |
| CN | 104700780 | * | 6/2015 |
| CN | 104978926 A | | 10/2015 |
| CN | 105336292 | * | 2/2016 |
| CN | 105405397 A | | 3/2016 |
| CN | 204409042 | * | 6/2017 |
| CN | 107204172 A | | 9/2017 |
| JP | 2006018168 A | | 1/2006 |
| TW | 201532019 A | | 8/2015 |

OTHER PUBLICATIONS

Taiwanese Office Action dated Apr. 8, 2019 and English translation of the page which lists the cited references in corresponding application No. 107121973; 4 pgs.

* cited by examiner

PIXEL CIRCUITS, DRIVING METHODS THEREOF AND DISPLAY DEVICES SOLVING AN UNEVEN DISPLAY LUMINANCE

CROSS REFERENCE

This application is a continuation of International Application No. PCT/CN2018/091232, filed on Jun. 14, 2018, which claims priority to Chinese Patent Application No. 201711047038.4 entitled "PIXEL CIRCUITS, DRIVING METHODS THEREOF AND DISPLAY DEVICES" filed on Oct. 31, 2017, the contents of which are expressly incorporated by reference herein in their entireties.

FIELD

The disclosure relates to display technologies, and in particular to pixel circuits, driving methods thereof and display devices.

BACKGROUND

An organic light-emitting display device is a display device in which an organic light-emitting diode is used as a light-emitting component, and has characteristics of high contrast, thin thickness, wide viewing angle, fast response speed, low power consumption, etc., and is increasingly applied to various fields of display and illumination.

In existing organic light-emitting display devices, a plurality of pixel circuits may be generally included. The plurality of pixel circuits are generally supplied with power supply voltages from a same power source. The power supply voltage can determine a current flowing through a light-emitting diode in the pixel circuit.

However, in practical applications, when the power supply voltage is transmitted between the plurality of pixel circuits, an power supply voltage drop (IR drop) is inevitably generated, resulting in different actual power supply voltages applied in each pixel circuit, and further resulting in different currents flowing through each light-emitting diode and uneven display luminance of display devices.

SUMMARY

The main purpose of the disclosure is to provide a pixel circuit, a driving method thereof and a display device, which are intended to solve the problem of an uneven display luminance of a display device due to different currents flowing through light-emitting diodes caused by a power supply voltage drop.

In order to achieve the above purpose, the pixel circuit provided by the disclosure comprises a first thin film transistor, a second thin film transistor, a third thin film transistor, a fourth thin film transistor, a fifth thin film transistor, a sixth thin film transistor, a seventh thin film transistor, a light-emitting diode and a storage capacitor, a gate of the first thin film transistor being separately connected to a drain of the second thin film transistor, a source of the third thin film transistor and one terminal of the storage capacitor, a source of the second thin film transistor being connected to an initial voltage signal line, the other terminal of the storage capacitor being separately connected to a drain of the fourth thin film transistor and a source of the fifth thin film transistor, and a source of the fourth thin film transistor being connected to a reference voltage signal line;

a source of the first thin film transistor being separately connected to a drain of the fifth thin film transistor, a drain of the sixth thin film transistor and a source of the seventh thin film transistor, a source of the sixth thin film transistor being connected to a first power source, and a drain of the seventh thin film transistor being connected to a data line;

a drain of the first thin film transistor being separately connected to a drain of the third thin film transistor and an anode of the light-emitting diode, and a cathode of the light-emitting diode being connected to a second power source.

Optionally, the first power source supplies a power source voltage to the first thin film transistor; a current flows into the second power source when the light-emitting diode emits light.

Optionally, the reference voltage signal line provides a reference voltage; the initial voltage signal line provides an initial voltage, and the initial voltage initializes the gate of the first thin film transistor and the one terminal of the storage capacitor; the data line provides a data voltage; and the reference voltage and the initial voltage are negative voltages.

Optionally, a gate of the second thin film transistor is connected to a first scan line, when a first scan signal provided by the first scan line controls the second thin film transistor to make the second thin film transistor in an on-state, the initial voltage initializes the gate of the first thin film transistor and one terminal of the storage capacitor;

a gate of the fourth thin film transistor is connected to a second scan line, when a second scan signal provided by the second scan line controls the fourth thin film transistor to make the fourth thin film transistor in the on-state, the reference voltage applies a voltage to the other terminal of the storage capacitor;

a gate of the third thin film transistor and a gate of the seventh thin film transistor are connected to a third scan line, when a third scan signal provided by the third scan line controls the third thin film transistor and the seventh thin film transistor to make the third thin film transistor and the seventh thin film transistor in the on-state, a threshold voltage of the first thin film transistor is compensated;

a gate of the fifth thin film transistor and a gate of the sixth thin film transistor are connected to a fourth scan line, when a fourth scan signal provided by the fourth scan line controls the fifth thin film transistor and the sixth thin film transistor to make the fifth thin film transistor and the sixth thin film transistor in the on-state, a current flows through the light-emitting diode.

Optionally, when the fourth scan line controls the fifth thin film transistor and the sixth thin film transistor to make the fifth thin film transistor and the sixth thin film transistor in the on-state, the first power source separately applies voltages to the source of the first thin film transistor M1 and the other terminal of the storage capacitor, and the current flowing through the light-emitting diode is independent of the first power source under an action of the storage capacitor.

Optionally, the first thin film transistor is a driving thin film transistor and a P-type thin film transistor; and each of the second thin film transistor, the third thin film transistor, the fourth thin film transistor, the fifth thin film transistor, the sixth thin film transistor and the seventh thin film transistor is independently a N-type thin film transistor or P-type thin film transistor.

The exemplary embodiments of the disclosure also provide a driving method of a pixel circuit, which is used to drive the pixel circuit recorded above, wherein the driving method comprising:

in a first stage, controlling, by the first scan signal, the second thin film transistor to change the second thin film transistor from an off-state to an on-state and initializing, by the initial voltage, the gate of the first thin film transistor and one terminal of the storage capacitor, and controlling, by the second scan signal, the fourth thin film transistor to change the fourth thin film transistor from the off-state to the on-state and applying, by the reference voltage, a voltage to the other terminal of the storage capacitor, and controlling, by the third scan signal, the third thin film transistor and the seventh thin film transistor to make the third thin film transistor and the seventh thin film transistor in the off-state, and controlling, by the fourth scan signal, the fifth thin film transistor and the sixth thin film transistor to change the fifth thin film transistor and the sixth thin film transistor from the on-state to the off-state;

in a second stage, controlling, by the first scan signal, the second thin film transistor to change the second thin film transistor from the on-state to the off-state, and controlling, by the second scan signal, the fourth thin film transistor to change the fourth thin film transistor from the on-state to the off-state, and controlling, by the third scan signal, the third thin film transistor and the seventh thin film transistor to change the third thin film transistor and the seventh thin film transistor from the off-state to the on-state and compensating for the threshold voltage of the first thin film transistor, and controlling, by the fourth scan signal, the fifth thin film transistor and the sixth thin film transistor to make the fifth thin film transistor and the sixth thin film transistor in the off-state;

in a third stage, controlling, by the first scan signal, the second thin film transistor to make the second thin film transistor in the off-state, and controlling, by the second scan signal, the fourth thin film transistor to make the fourth thin film transistor in the off-state, and controlling, by the third scan signal, the third thin film transistor and the seventh thin film transistor to change the third thin film transistor and the seventh thin film transistor from the on-state to the off-state, and controlling, by the fourth scan signal, the fifth thin film transistor and the sixth thin film transistor to change the fifth thin film transistor and the sixth thin film transistor from the off-state to the on-state, and a current flowing through the light-emitting diode and the light-emitting diode emitting light.

Optionally, in the first stage, a gate voltage of the first thin film transistor and a voltage of the one terminal of the storage capacitor are Vint, a voltage of the other terminal of the storage capacitor is Vref, Vint is an initial voltage, and Vref is a reference voltage.

Optionally, in the second stage, the gate of the first thin film transistor is connected to the drain of the first thin film transistor, a data voltage applies a voltage to the source of the first thin film transistor to make the gate voltage of the first thin film transistor be Vdata+Vth, a threshold voltage of the first thin film transistor is compensated, and Vth is the threshold voltage of the first thin film transistor.

Optionally, in the third stage, the first power source applies a voltage to the source of the first thin film transistor and the other terminal of the storage capacitor, a voltage of the other terminal of the storage capacitor is changed from Vref to VDD, and under an action of the storage capacitor, a gate voltage of the first thin film transistor is VDD-Vref+Vdata+Vth to make a current flowing through the light-emitting diode independent of the first power source, and VDD is the first power source.

The exemplary embodiments of the disclosure also provide a display device, and the display device comprises the pixel circuit recorded above.

The above at least one technical solution adopted by the exemplary embodiments of the disclosure can achieve the following beneficial effect:

The pixel circuit provided by the exemplary embodiments of the disclosure comprises seven thin film transistors, a light-emitting diodes and a storage capacitor, and the pixel circuit can achieve the compensation for the power supply voltage during the light-emitting stage of the light-emitting diode, so that a current flowing through the light-emitting diode is relevant to a data voltage and a reference voltage inputted into the pixel circuit, and is independent of the power supply voltage, thereby effectively avoiding the problem of the uneven display of the display device due to different currents flowing into each light-emitting diode caused by power supply voltage drop.

In addition, the pixel circuit provided by the exemplary embodiments of the disclosure can also compensate for the threshold voltage of a drive thin film transistor, thereby effectively avoiding the problem of the uneven display of the display device due to different threshold voltages of the drive thin film transistors.

Implementation of objectives, functional features and advantages of the disclosure will be further described with reference to accompanying drawings.

DETAILED DESCRIPTION

It should be noted that in pixel circuits provided by exemplary embodiments of the disclosure, a first thin film transistor is a driving thin film transistor, specifically, a P-type thin film transistor; a second thin film transistor, a third thin film transistor, a fourth thin film transistor, a fifth thin film transistor, a sixth thin film transistor, and a seventh thin film transistor may all be P-type thin film transistors or N-type thin film transistors; alternatively, at least one of them may be a P-type thin film transistor and the remaining are N-type thin film transistors, and exemplary embodiments of the disclosure are not specifically limited.

In the exemplary embodiments of the disclosure, as for different types of thin film transistors, scan signals provided by different scan lines may be different. The exemplary embodiment of the disclosure is described by an example of a first thin film transistor to a seventh thin film transistor all being P-type thin film transistors.

A light-emitting diode may be an LED or an OLED, and is not specifically limited herein. The exemplary embodiment of the disclosure may be described by taking the light-emitting diode as OLEDs for example.

Technical solutions provided by the exemplary embodiments of the disclosure are described in detail below with reference to accompanying drawings.

Figure 1:
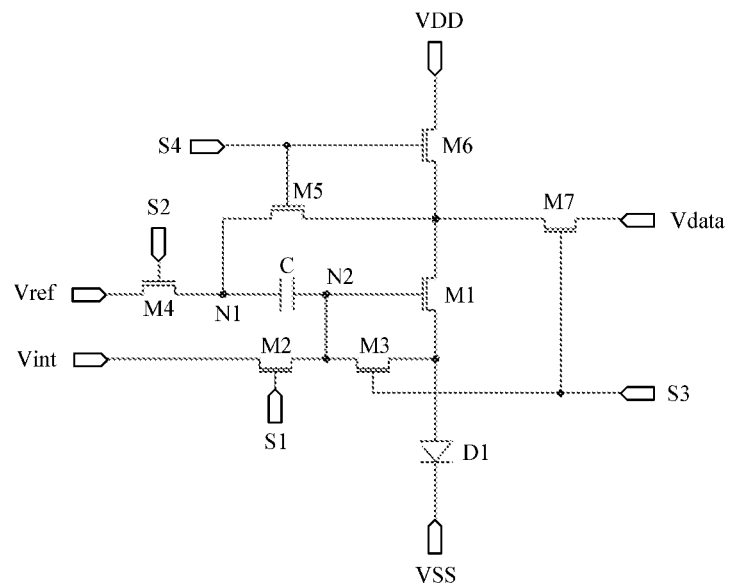
FIG. 1 is a schematic diagram of a pixel circuit provided by an exemplary embodiment of the disclosure.

FIG. 1 is a schematic diagram of a pixel circuit provided by an exemplary embodiment of the disclosure. The pixel circuit is as follows.

As shown in FIG. 1, the pixel circuit includes a first thin film transistor M1, a second thin film transistor M2, a third thin film transistor M3, a fourth thin film transistor M4, a fifth thin film transistor M5, a sixth thin film transistor M6, a seventh thin film transistor M7, a storage capacitor C and a light-emitting diode D1.

In the pixel circuit shown in FIG. 1, the first thin film transistor M1, the second thin film transistor M2, the third thin film transistor M3, the fourth thin film transistor M4, the fifth thin film transistor M5, the sixth thin film transistor M6 and the seventh thin film transistor M7 are all P-type thin film transistors, and the light-emitting diode D1 is an OLED.

A circuit connection structure of the pixel circuit shown in FIG. 1 is as follows:

a gate of the first thin film transistor M1 is separately connected to a drain of the second thin film transistor M2, a source of the third thin film transistor M3 and one terminal of the storage capacitor C (the N2 point shown in FIG. 1), and a source of the first thin film transistor M1 is separately connected to a drain of the fifth thin film transistor M5, a drain of the sixth thin film transistor M6 and a source of the seventh thin film transistor M7, and a drain of the first thin film transistor M1 is separately connected to a drain of the third thin film transistor M3 and an anode of the light-emitting diode D1;

a source of the second thin film transistor M2 is connected to an initial voltage signal line;

a source of the fourth thin film transistor M4 is connected to a reference voltage signal line, and a drain of the fourth thin film transistor M4 is separately connected to a source of the fifth thin film transistor M5 and the other terminal of the storage capacitor C (the N1 point shown in FIG. 1);

a source of the sixth thin film transistor M6 is connected to a first power source VDD;

a drain of the seventh thin film transistor M7 is connected to a data line;

a cathode of the light-emitting diode D1 is connected to a second power source VSS.

In the exemplary embodiment of the disclosure, the first power source VDD may be a positive voltage and used to supply a power source voltage to the first thin film transistor M1. The first thin film transistor M1 may output a current under an action of the first power source VDD, and the current flows into the light-emitting diode D1 so that the light-emitting diode D1 emits light. When the light-emitting diode D1 emits light, the current flows into the second power source VSS, and the second power source VSS may be a negative voltage.

A data voltage signal line may be used to provide a data voltage Vdata, a reference voltage signal line may be used to provide a reference voltage Vref, and an initial voltage signal line may be used to provide an initial voltage Vint. The initial voltage Vint may initialize the gate of the first thin film transistor M1 and one terminal of the storage capacitor C (the N2 point shown in FIG. 1, that is, a right plate of the storage capacitor C). In the exemplary embodiment of the disclosure, the reference voltage Vref and the initial voltage Vint may both be negative voltages.

In the pixel circuit shown in FIG. 1, S1 is a first scan signal provided by a first scan line, S2 is a second scan signal provided by a second scan line, S3 is a third scan signal provided by a third scan line, and S4 is a fourth scan signal provided by a fourth scan line, and:

a gate of the second thin film transistor M2 is connected to the first scan line, and the first scan signal S1 provided by the first scan line may control the second thin film transistor M2 to make it in an on-state or off-state;

a gate of the fourth thin film transistor M4 is connected to the second scan line, and the second scan signal S2 provided by the second scan line may control the fourth thin film transistor M4 to make it in the on-state or off-state;

a gate of the third thin film transistor M3 and a gate of the seventh thin film transistor M7 are connected to the third scan line, and the third scan signal S3 provided by the third scan line may control the third thin film transistor M3 and the seventh thin film transistor M7 to make them in the on-state or off-state;

a gate of the fifth thin film transistor M5 and a gate of the sixth thin film transistor M6 are connected to the fourth scan line, and the fourth scan signal S4 provided by the fourth scan line may control the fifth thin film transistor M5 and the sixth thin film transistor M6 to make them in the on-state or off-state.

In the exemplary embodiment of the disclosure, when the first scan signal S1 controls the second thin film transistor M2 to make it in the on-state, the initial voltage Vint may apply a voltage to the gate of the first thin film transistor M1 and one terminal of the storage capacitor C (the N2 point shown in FIG. 1, that is, the right plate of the storage capacitor C) via the second thin film transistor M2, and initialize the gate of the first thin film transistor M1 and the right plate of the storage capacitor C.

When the second scan signal S2 controls the fourth thin film transistor M4 to make it in the on-state, the reference voltage Vref may apply a voltage to the other terminal of the storage capacitor C (N1 point shown in FIG. 1, that is, the left plate of the storage capacitor C) via the fourth thin film transistor M4, and the reference voltage Vref is inputted into the pixel circuit, and a voltage of the left plate of the storage capacitor C (point N1 shown in FIG. 1) is Vref.

When the third scan signal S3 controls the third thin film transistor M3 and the seventh thin film transistor M7 to make them in the on-state, the gate and the drain of the first thin film transistor M1 are connected, and the data voltage Vdata applies a voltage to the source of the first film transistor M1 via the seventh thin film transistor M7, and charges the gate of the first thin film transistor M1 via the drain of the first thin film transistor M1, and after the state of the circuit is stabilized, a gate voltage and a drain voltage of the first thin film transistor M1 are both Vdata+Vth, and Vth is a threshold voltage of the first thin film transistor M1.

When the fourth scan signal S4 controls the fifth thin film transistor M5 and the sixth thin film transistor M6 to make them in the on-state, the first power supply VDD applies a voltage to the source of the first thin film transistor M1 via the sixth thin film transistor M6, and under an action of the first power supply VDD, a current flows through the light-emitting diode D1, and the light-emitting diode D1 emits light. When the light-emitting diode D1 emits light, compensation for the threshold voltage of the first thin film transistor M1 can be achieved.

In the exemplary embodiment of the disclosure, when the fourth scan signal S4 controls the fifth thin film transistor M5 and the sixth thin film transistor M6 to make them in the on-state, the first power supply VDD may also apply a voltage to the other terminal of the storage capacitor C (the N1 point shown in FIG. 1, that is, the left plate of the storage capacitor C) via the fifth thin film transistor M5 so that the voltage of the left plate of the storage capacitor C is changed from Vref to VDD, and accordingly, the voltage of the right plate of the storage capacitor C (the N2 point shown in FIG. 1) is changed from Vdata+Vth to VDD−Vref+Vdata+Vth, that is, the gate voltage of the first thin film transistor M1 becomes VDD−Vref+Vdata+Vth. Thus, when the first power supply VDD applies a voltage to the source of the first thin film transistor M1 and a current flows through the light-emitting diode D1, in an equation of the current, the first power supply VDD acting on the source of the first thin film transistor M1 counteracts the VDD in the gate voltage of the first thin film transistor M1 so that the current flowing through the light-emitting diode D1 is independent of the first power supply VDD, thereby achieving the compensation for the first power supply VDD. Since the current flowing through the light-emitting diode D1 is independent of the first power source VDD, an influence of the power source voltage drop generated by the first power source VDD on display uniformity of a display device can be effectively avoided.

Figure 2:
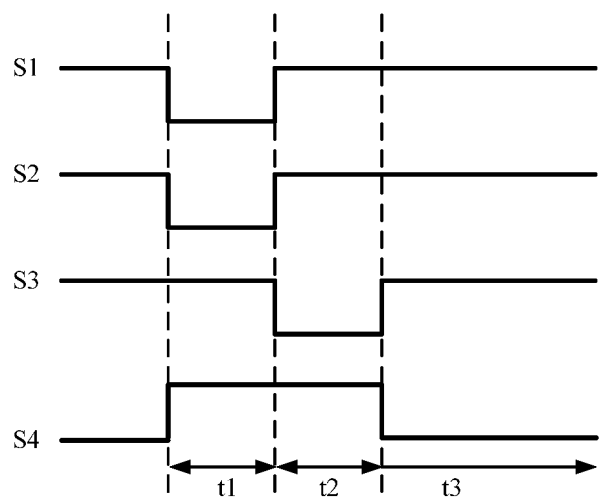
FIG. 2 is a timing diagram of a method for driving a pixel circuit provided by an exemplary embodiment of the disclosure.

FIG. 2 is a timing diagram of a method for driving a pixel circuit provided by an exemplary embodiment of the disclosure, and the method for driving the pixel circuit corresponding to the timing diagram may be used to drive the pixel circuit shown in FIG. 1.

The method for driving the pixel circuit corresponding to the timing diagram shown in FIG. 2 may include three stages: a first stage t1, a second stage t2 and a third stage t3. S1 may be the first scan signal provided by the first scan line described in the exemplary embodiment shown in FIG. 1, S2 may be the second scan signal provided by the second scan line described in the exemplary embodiment shown in FIG. 1, S3 may be the third scan signal provided by the third scan line described in the exemplary embodiment shown in FIG. 1 and S4 may be the fourth scan signal provided by the fourth scan line described in the exemplary embodiment shown in FIG. 1.

The method for driving the pixel circuit corresponding to the timing diagram shown in FIG. 2 specifically includes:

in the first stage t1, a first scan signal S1 controls a second thin film transistor M2 to change it from the off-state to the on-state, and an initial voltage Vint initializes a gate of a first thin film transistor M1 and one terminal of a storage capacitor C, and a second scan signal S2 controls a fourth thin film transistor M4 to change it from the off-state to the on-state, and a reference voltage Vref applies a voltage to the other terminal of the storage capacitor C, and a third scan signal S3 controls a third thin film transistor M3 and a seventh thin film transistor M7 to make them in the off-state, and a fourth scan signal S4 controls a fifth thin film transistor M5 and a sixth thin film transistor M6 to change them from the on-state to the off-state;

in the second stage t2, the first scan signal S1 controls the second thin film transistor M2 to change it from the on-state to the off-state, and the second scan signal S2 controls the fourth thin film transistor M4 to change it from the on-state to the off-state, and the third scan signal S3 controls the third thin film transistor M3 and the seventh thin film transistor M7 to change them from the off-state to the on-state, thereby compensating for the threshold voltage of the first thin film transistor M1, and the fourth scan signal S4 controls the fifth thin film transistor M5 and the sixth thin film transistor M6 to make them in the off-state;

in the third stage t3, the first scan signal S1 controls the second thin film transistor M2 to make it in the off-state, and the second scan signal S2 controls the fourth thin film transistor M4 to make it in the off-state, and the third scan signal S3 controls the third thin film transistor M3 and the seventh thin film transistor M7 to change them from the on-state to the off-state, and the fourth scan signal S4 controls the fifth thin film transistor M5 and the sixth thin film transistor M6 to change them from the off-state to the on-state, and a current flows through the light-emitting diode D1, and the light-emitting diode D1 emits light.

The following is a detailed analysis of the above three stages, respectively.

As for the first stage t1:

since the first scan signal S1 changes from a high level to a low level, the second scan signal S2 changes from a high level to a low level, the third scan signal S3 maintains a high level and the fourth scan signal S4 changes from a low level to a high level, the second thin film transistor M2 changes from the off-state to the on-state, the fourth thin film transistor M4 changes from the off-state to the on-state, the third thin film transistor M3 and the seventh thin film transistor M7 are in the off-state, and the fifth thin film transistor M5 and the sixth thin film transistor M6 change from the on-state to the off-state.

At this time, the initial voltage Vint applies a voltage to the gate of the first thin film transistor M1 and a right plate of the storage capacitor C (the N2 point shown in FIG. 1) via the second thin film transistor M2 so that both the gate voltage of the first thin film transistor M1 and the voltage of the right plate of the storage capacitor C become Vint, thereby achieving an initialization of the gate of the first thin film transistor M1 and the right plate of the storage capacitor C.

The reference voltage Vref applies a voltage to a left plate of the storage capacitor C (the N1 point shown in FIG. 1) via the fourth thin film transistor M4 so that the voltage of the left plate of the storage capacitor C becomes Vref, and the reference voltage Vref is written into the pixel circuit.

As for the second stage t2:

since the first scan signal S1 changes from a low level to a high level, the second scan signal S2 changes from a low level to a high level, the third scan signal S3 changes from a high level to a low level and the fourth scan signal S4 maintains a high level, the second thin film transistor M2 changes from the on-state to the off-state, the fourth thin film transistor M4 changes from the on-state to the off-state, the third thin film transistor M3 and the seventh thin film transistor M7 change from the off-state to the on-state, and the fifth thin film transistor M5 and the sixth thin film transistor M6 are still in the off-state.

At this time, the gate of the first thin film transistor M1 is connected to a drain of the first thin film transistor M1 via the third thin film transistor M3, and the data voltage Vdata applies a voltage to a source of the first thin film transistor M1 via the seventh thin film transistor M7 so that the source voltage of the first thin film transistor M1 is Vdata, and the data voltage Vdata may act on the gate of the first thin film transistor M1 via the drain of the first thin film transistor M1, and charge the gate of the first thin film transistor M1. After the circuit is stabilized, it can be known from characteristics of the thin film transistor M1, both the gate voltage and the drain voltage of the first thin film transistor M1 are Vdata+Vth. Thus, during a light-emitting stage of the light-emitting diode D1, the compensation for the threshold voltage of the first thin film transistor M1 can be realized, and Vth is the threshold voltage of the first thin film transistor M1.

As for the third stage t3:

since the first scan signal S1 maintains the high level, the second scan signal S2 maintains the high level, the third scan signal S3 changes from the low level to the high level and the fourth scan signal S4 changes from the high level to the low level, the second thin film transistor M2 is in the off-state, the fourth thin film transistor M4 is in the off-state, the third thin film transistor M3 and the seventh thin film transistor M7 change from the on-state to the off-state, and the fifth thin film transistor M5 and the sixth thin film transistor M6 change from the off-state to the on-state.

At this time, a first power source VDD applies a voltage to the source of the first thin film transistor M1 via the sixth thin film transistor M6 so that the source voltage of the first thin film transistor M1 becomes VDD, and at the same time, the first power source VDD applies a voltage to the left plate of the storage capacitor C (the N1 point shown in FIG. 1) via the fifth thin film transistor M5 so that the voltage of the left plate of the storage capacitor C changes from Vref to VDD, and accordingly, the voltage of the right plate of the storage capacitor C (the N2 point shown in FIG. 1) is changed from Vdata+Vth to VDD-Vref+Vdata+Vth. Since the gate voltage of the first thin film transistor M1 is equal to the voltage of the right plate of the storage capacitor C, the gate voltage of the first thin film transistor M1 is VDD-Vref+Vdata+Vth.

Under the action of the first power source VDD, the first thin film transistor M1 generates a driving current, and the driving current flows through the light-emitting diode D1 so that the light-emitting diode D1 emits light.

In the third stage t3, the current flowing through the light-emitting diode D1 can be expressed as:

$$I_{OLED} = \mu C_{ox} \frac{W}{2L} (V_{gs} - Vth)^2 =$$

$$\mu C_{ox} \frac{W}{2L} (V_g - V_s - Vth)^2 = \mu C_{ox} \frac{W}{2L} (Vdata - Vref)^2$$

μ is an electron mobility of the first thin film transistor M1, $C_{ox}$ is a gate oxide layer capacitance per unit area of the first thin film transistor M1, W/L is an aspect ratio of the first thin film transistor M1, Vs is the source voltage VDD of the first thin film transistor M1, and Vg is the gate voltage VDD−Vref+Vdata+Vth of the first thin film transistor M1.

It can be known from the above equation that the current flowing through the light-emitting diode D1 is related to the data voltage Vdata and the reference voltage Vref, and is independent of the first power supply VDD, and is also independent of the threshold voltage of the first thin film transistor M1, thereby realizing the compensation for the first power supply VDD, avoiding the influence of the power supply voltage drop of the first power source VDD on the display effect and ensuring the display uniformity of the display device, and at the same time, realizing the compensation for the threshold voltage of the first thin film transistor M1 and avoiding the problem of the uneven display of the display device due to different threshold voltages of first thin film transistors M1.

The driving method of the pixel circuit provided by the exemplary embodiments of the disclosure can compensate the power supply voltage during the light-emitting stage of the light-emitting diode, so that the current flowing through the light-emitting diode is related to the data voltage and the reference voltage inputted into the pixel circuit, and is independent of the power source voltage, thereby effectively avoiding the problem of the uneven display of the display device due to different currents flowing into each light-emitting diode caused by power supply voltage drop.

The exemplary embodiments of the disclosure further provide a display device, and the display device may include the pixel circuits described above.

It is apparent that a person skilled in the art can make various modifications and variations of the disclosure without departing from the scope of the disclosure. Thus, if such modifications and variations of the disclosure are within the scope of the claims of the disclosure and the technical equivalents thereof, the disclosure is also intended to include such modifications and variations.

What is claimed is:

1. A pixel circuit, comprising:
a first thin film transistor, a second thin film transistor, a third thin film transistor, a fourth thin film transistor, a fifth thin film transistor, a sixth thin film transistor, a seventh thin film transistor, a light-emitting diode and a storage capacitor,
a gate of the first thin film transistor being separately connected to a drain of the second thin film transistor, a source of the third thin film transistor and one terminal of the storage capacitor, a source of the second thin film transistor being connected to an initial voltage signal line, the other terminal of the storage capacitor being separately connected to a drain of the fourth thin film transistor and a source of the fifth thin film transistor, a source of the fourth thin film transistor being connected to a reference voltage signal line;
a source of the first thin film transistor being separately connected to a drain of the fifth thin film transistor, a drain of the sixth thin film transistor and a source of the seventh thin film transistor, a source of the sixth thin film transistor being connected to a first power source, a drain of the seventh thin film transistor being connected to a data line;
a drain of the first thin film transistor being separately connected to a drain of the third thin film transistor and an anode of the light-emitting diode, a cathode of the light-emitting diode being connected to a second power source,
wherein gates of the fourth thin film transistor and the seventh thin film transistor are controlled by different scan signals,
wherein Vint is assigned, via the second thin film transistor, on the gate of the first thin film transistor and the one terminal of the storage capacitor, the Vint is an initial voltage that initializes the gate of the first thin film transistor and the one terminal of the storage capacitor when the second thin film transistor is on-state, and Vref is a reference voltage assigned, via the fourth thin film transistor, on the other terminal of the storage capacitor when the fourth thin film transistor is on-state,
wherein on or off-state of the second and fourth thin film transistors are same in each scanning stage,
wherein the gate of the fourth thin film transistor is connected to a second scan line, when a second scan signal provided by the second scan line controls the fourth thin film transistor to make the fourth thin film transistor in the on-state, the reference voltage applies a voltage to the other terminal of the storage capacitor,
wherein the fourth thin film transistor is the on-state by the second scan signal only during an initial scanning stage,
wherein a first stage, a second stage and a third stage are provided as the scanning stage of the pixel circuit,
wherein in the first stage, a gate voltage of the first thin film transistor and a voltage of the one terminal of the storage capacitor are the Vint, a voltage of the other terminal of the storage capacitor is the Vref,
wherein in the second stage, the gate of the first thin film transistor is connected to the drain of the first thin film transistor, a data voltage applies a voltage to the source of the first thin film transistor to make the gate voltage of the first thin film transistor be Vdata+Vth, a threshold voltage of the first thin film transistor is compensated, and Vth is the threshold voltage of the first thin film transistor, wherein in the third stage, the first power source applies a voltage to the source of the first thin film transistor and the other terminal of the storage capacitor, the voltage of the other terminal of the storage capacitor is changed from Vref to VDD, and under an action of the storage capacitor, the gate voltage of the first thin film transistor is VDD-Vref+Vdata+Vth to make a current flowing through the light-emitting diode independent of the first power source, and VDD is the first power source, wherein a first scan signal controls the second thin film transistor for the Vint, the second scan signal controls the fourth thin film transistor for the Vref, and on or off-states of the second and fourth film transistors are the same within the first stage.

2. The pixel circuit according to claim 1, wherein the first power source supplies a power source voltage to the first thin film transistor; and a current flows into the second power source when the light-emitting diode emits light.

3. The pixel circuit according to claim 1, wherein the reference voltage signal line provides a reference voltage;

the initial voltage signal line provides an initial voltage, the initial voltage initializes the gate of the first thin film transistor and the one terminal of the storage capacitor;

the data line provides a data voltage; and the reference voltage and the initial voltage are negative voltages.

4. The pixel circuit according to claim 3, wherein a gate of the second thin film transistor is connected to a first scan line, when the first scan signal provided by the first scan line controls the second thin film transistor to make the second thin film transistor in an on-state, the initial voltage initializes the gate of the first thin film transistor and one terminal of the storage capacitor;

a gate of the third thin film transistor and the gate of the seventh thin film transistor are connected to a third scan line, when a third scan signal provided by the third scan line controls the third thin film transistor and the seventh thin film transistor to make the third thin film transistor and the seventh thin film transistor in the on-state, a threshold voltage of the first thin film transistor is compensated;

a gate of the fifth thin film transistor and a gate of the sixth thin film transistor are connected to a fourth scan line, when a fourth scan signal provided by the fourth scan line controls the fifth thin film transistor and the sixth thin film transistor to make the fifth thin film transistor and the sixth thin film transistor in the on-state, a current flows through the light-emitting diode.

5. The pixel circuit according to claim 4, wherein when the fourth scan line controls the fifth thin film transistor and the sixth thin film transistor to make the fifth thin film transistor and the sixth thin film transistor in the on-state, the first power source separately applies voltages to the source of the first thin film transistor and the other terminal of the storage capacitor, and the current flowing through the light-emitting diode is independent of the first power source under an action of the storage capacitor.

6. The pixel circuit according to claim 1, wherein the first thin film transistor is a driving thin film transistor and a P-type thin film transistor; and each of the second thin film transistor, the third thin film transistor, the fourth thin film transistor, the fifth thin film transistor, the sixth thin film transistor and the seventh thin film transistor is independently a N-type thin film transistor or P-type thin film transistor.

7. A driving method of a pixel circuit, the pixel circuit having a first thin film transistor, a second thin film transistor, a third thin film transistor, a fourth thin film transistor, a fifth thin film transistor, a sixth thin film transistor, a seventh thin film transistor, a light-emitting diode and a storage capacitor, a gate of the first thin film transistor being separately connected to a drain of the second thin film transistor, a source of the third thin film transistor and one terminal of the storage capacitor, a source of the second thin film transistor being connected to an initial voltage signal line, the other terminal of the storage capacitor being separately connected to a drain of the fourth thin film transistor and a source of the fifth thin film transistor, and a source of the fourth thin film transistor being connected to a reference voltage signal line;

a source of the first thin film transistor being separately connected to a drain of the fifth thin film transistor, a drain of the sixth thin film transistor and a source of the seventh thin film transistor, a source of the sixth thin film transistor being connected to a first power source, and a drain of the seventh thin film transistor being connected to a data line;

a drain of the first thin film transistor being separately connected to a drain of the third thin film transistor and an anode of the light-emitting diode, and a cathode of the light-emitting diode being connected to a second power source, wherein gates of the fourth thin film transistor and the seventh thin film transistor are controlled by different scan signals, wherein the gate of the fourth thin film transistor is connected to a second scan line, when a second scan signal provided by the second scan line controls the fourth thin film transistor to make the fourth thin film transistor in the on-state, the reference voltage applies a voltage to the other terminal of the storage capacitor, wherein the fourth thin film transistor is the on-state by the second scan signal only during an initial scanning stage, wherein in the first stage, a gate voltage of the first thin film transistor and a voltage of the one terminal of the storage capacitor are the Vint, a voltage of the other terminal of the storage capacitor is the Vref, wherein in the second stage, the gate of the first thin film transistor is connected to the drain of the first thin film transistor, a data voltage applies a voltage to the source of the first thin film transistor to make the gate voltage of the first thin film transistor be Vdata+Vth, a threshold voltage of the first thin film transistor is compensated, and Vth is the threshold voltage of the first thin film transistor, wherein in the third stage, the first power source applies a voltage to the source of the first thin film transistor and the other terminal of the storage capacitor, the voltage of the other terminal of the storage capacitor is changed from Vref to VDD, and under an action of the storage capacitor, the gate voltage of the first thin film transistor is VDD-Vref+Vdata+Vth to make a current flowing through the light-emitting diode independent of the first power source, and VDD is the first power source, wherein a first scan signal controls the second thin film transistor for the Vint, the second scan signal controls the fourth thin film transistor for the Vref, and on or off-states of the second and fourth film transistors are the same within the first stage, the driving method comprising:

in a first stage, controlling, by the first scan signal, the second thin film transistor to change the second thin film transistor from an off-state to an on-state and initializing, by the initial voltage, the gate of the first thin film transistor and one terminal of the storage capacitor, and controlling, by the second scan signal, the fourth thin film transistor to change the fourth thin film transistor from the off-state to the on-state and applying, by the reference voltage, a voltage to the other terminal of the storage capacitor, and controlling, by a third scan signal, the third thin film transistor and the seventh thin film transistor to make the third thin film transistor and the seventh thin film transistor in the off-state, and controlling, by a fourth scan signal, the fifth thin film transistor and the sixth thin film transistor to change the fifth thin film transistor and the sixth thin film transistor from the on-state to the off-state;

in a second stage, controlling, by the first scan signal, the second thin film transistor to change the second thin film transistor from the on-state to the off-state, and controlling, by the second scan signal, the fourth thin film transistor to change the fourth thin film transistor from the on-state to the off-state, and controlling, by the third scan signal, the third thin film transistor and the seventh thin film transistor to change the third thin film transistor and the seventh thin film transistor from the off-state to the on-state and compensating for the threshold voltage of the first thin film transistor, and controlling, by the fourth scan signal, the fifth thin film transistor and the sixth thin film transistor to make the fifth thin film transistor and the sixth thin film transistor in the off-state;

in a third stage, controlling, by the first scan signal, the second thin film transistor to make the second thin film transistor in the off-state, and controlling, by the second scan signal, the fourth thin film transistor to make the fourth thin film transistor in the off-state, and controlling, by the third scan signal, the third thin film transistor and the seventh thin film transistor to change the third thin film transistor and the seventh thin film transistor from the on-state to the off-state, and controlling, by the fourth scan signal, the fifth thin film transistor and the sixth thin film transistor to change the fifth thin film transistor and the sixth thin film transistor from the off-state to the on-state, and a current flowing through the light-emitting diode and the light-emitting diode emitting light, wherein Vint is assigned, via the second thin film transistor, on the gate of the first thin film transistor and the one terminal of the storage capacitor, the Vint is the initial voltage that initializes the gate of the first thin film transistor and the one terminal of the storage capacitor when the second thin film transistor is on-state, and Vref is the reference voltage assigned, via the fourth thin film transistor, on the other terminal of the storage capacitor when the fourth thin film transistor is on-state, and wherein on or off-state of the second and fourth thin film transistors are same in each scanning stage.

8. A display device, comprising a pixel circuit, the pixel circuit comprising:

a first thin film transistor, a second thin film transistor, a third thin film transistor, a fourth thin film transistor, a fifth thin film transistor, a sixth thin film transistor, a seventh thin film transistor, a light-emitting diode and a storage capacitor, a gate of the first thin film transistor being separately connected to a drain of the second thin film transistor, a source of the third thin film transistor and one terminal of the storage capacitor, a source of the second thin film transistor being connected to an initial voltage signal line, the other terminal of the storage capacitor being separately connected to a drain of the fourth thin film transistor and a source of the fifth thin film transistor, and a source of the fourth thin film transistor being connected to a reference voltage signal line;

a source of the first thin film transistor being separately connected to a drain of the fifth thin film transistor, a drain of the sixth thin film transistor and a source of the seventh thin film transistor, a source of the sixth thin film transistor being connected to a first power source, and a drain of the seventh thin film transistor being connected to a data line;

a drain of the first thin film transistor being separately connected to a drain of the third thin film transistor and an anode of the light-emitting diode, and a cathode of the light-emitting diode being connected to a second power source, wherein gates of the fourth thin film transistor and the seventh thin film transistor are controlled by different scan signals, wherein Vint is assigned, via the second thin film transistor, on the gate of the first thin film transistor and the one terminal of the storage capacitor, the Vint is an initial voltage that initializes the gate of the first thin film transistor and the one terminal of the storage capacitor when the second thin film transistor is on-state, and Vref is a reference voltage assigned, via the fourth thin film transistor, on the other terminal of the storage capacitor when the fourth thin film transistor is on-state, wherein on or off-state of the second and fourth thin film transistors are same in each scanning stage, wherein the gate of the fourth thin film transistor is connected to a second scan line, when a second scan signal provided by the second scan line controls the fourth thin film transistor to make the fourth thin film transistor in the on-state, the reference voltage applies a voltage to the other terminal of the storage capacitor, wherein the fourth thin film transistor is the on-state by the second scan signal only during an initial scanning stage, wherein a first stage, a second stage and a third stage are provided as the scanning stage of the pixel circuit, wherein in the first stage, a gate voltage of the first thin film transistor and a voltage of the one terminal of the storage capacitor are the Vint, a voltage of the other terminal of the storage capacitor is the Vref, wherein in the second stage, the gate of the first thin film transistor is connected to the drain of the first thin film transistor, a data voltage applies a voltage to the source of the first thin film transistor to make the gate voltage of the first thin film transistor be Vdata+Vth, a threshold voltage of the first thin film transistor is compensated, and Vth is the threshold voltage of the first thin film transistor, wherein in the third stage, the first power source applies a voltage to the source of the first thin film transistor and the other terminal of the storage capacitor, the voltage of the other terminal of the storage capacitor is changed from Vref to VDD, and under an action of the storage capacitor, the gate voltage of the first thin film transistor is VDD-Vref+Vdata+Vth to make a current flowing through the light-emitting diode independent of the first power source, and VDD is the first power source, wherein a first scan signal controls the second thin film transistor for the Vint, the second scan signal controls the fourth thin film transistor for the Vref, and on or off-states of the second and fourth film transistors are the same within the first stage.

* * * * *